United States Patent [19]
Cliff

[11] Patent Number: 6,122,720
[45] Date of Patent: Sep. 19, 2000

[54] COARSE-GRAINED LOOK-UP TABLE ARCHITECTURE

[75] Inventor: Richard G. Cliff, Milpitas, Calif.

[73] Assignee: Altera Corporation, San Jose, Calif.

[21] Appl. No.: 09/130,874

[22] Filed: Aug. 7, 1998

Related U.S. Application Data

[63] Continuation of application No. 08/484,831, Jun. 7, 1995, Pat. No. 5,815,726, which is a continuation-in-part of application No. 08/334,879, Nov. 4, 1994, abandoned.

[51] Int. Cl.[7] ................................................. G06F 13/00
[52] U.S. Cl. ................................... 712/15; 711/100
[58] Field of Search ........................... 712/15; 711/11, 711/100

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,020,469 | 4/1977 | Manning | 340/172 |
| 4,124,899 | 11/1978 | Birkner | 364/716 |
| 4,546,273 | 10/1985 | Osman | 307/468 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra et al. | 307/465 |
| 4,706,216 | 11/1987 | Carter | 365/94 |
| 4,713,792 | 12/1987 | Hartmann et al. | 364/900 |
| 4,717,912 | 1/1988 | Harvey | 340/825.8 |
| 4,727,268 | 2/1988 | Hori | 326/41 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,015,884 | 5/1991 | Agrawal et al. | 326/39 |
| 5,121,006 | 6/1992 | Pedersen et al. | 307/465 |
| 5,241,224 | 8/1993 | Pedersen et al. | 307/465 |
| 5,258,668 | 11/1993 | Cliff et al. | 326/41 |
| 5,260,610 | 11/1993 | Pedersen et al. | 307/465 |
| 5,260,611 | 11/1993 | Cliff et al. | 326/39 |
| 5,267,187 | 11/1993 | Hsieh et al. | 364/784 |
| 5,311,080 | 5/1994 | Britton | 307/465 |

(List continued on next page.)

FOREIGN PATENT DOCUMENTS

| | | |
|---|---|---|
| 1444084 | 7/1976 | United Kingdom . |
| WO 95/16993 | 6/1995 | WIPO . |

OTHER PUBLICATIONS

Xilinx Corp., *The Programmable Logic Data Book*, "XC4000, XC4000A, XC4000H Logic Cell Array Families," pp. 2–7 to 2–49 (1994).

Xilinx Corp., *The Programmable Logic Data Book*, "XC3000, XC3000A, XC3000L, XC3100, XC3100A Logic Cell Array Families," pp. 2–105 to 2–124 (1994).

(List continued on next page.)

*Primary Examiner*—Eric Coleman
*Attorney, Agent, or Firm*—Townsend and Townsend and Crew LLP

[57] ABSTRACT

A new programmable logic device architecture with an improved LAB and improved interconnection resources. For interconnecting signals to and from the LABs (200), the global interconnection resources include switch boxes (310), long lines (340 and 350), double lines (360 and 370), single lines (385), and half- (330) and partially populated (320) multiplexer regions. The LAB includes two levels of function blocks. In a first level, there are eight four-input function blocks (601). In a second level, there are two four-input function blocks (670) and four secondary two-input function blocks (672). In one embodiment, these function blocks are implemented using look-up tables (LUTs). The LAB has combinatorial and registered outputs. The LAB also contains storage blocks (691) for implementing sequential or registered logic functions. The LAB has a carry chain for implementing logic functions requiring carry bits. The LAB may also be configured to implement a random access memory.

56 Claims, 8 Drawing Sheets

U.S. PATENT DOCUMENTS

| | | | |
|---|---|---|---|
| 5,317,212 | 5/1994 | Wahlstrom | 307/465 |
| 5,338,984 | 8/1994 | Sutherland | 307/465.1 |
| 5,350,954 | 9/1994 | Patel et al. | 307/465 |
| 5,371,422 | 12/1994 | Patel et al. | 326/41 |
| 5,375,086 | 12/1994 | Wahlstrom | 365/149 |
| 5,394,033 | 2/1995 | Tsui | 326/41 |
| 5,444,394 | 8/1995 | Watson et al. | 326/45 |
| 5,463,328 | 10/1995 | Cope et al. | 326/41 |
| 5,473,266 | 12/1995 | Ahanin et al. | 326/41 |
| 5,546,018 | 8/1996 | New et al. | 326/38 |
| 5,550,782 | 8/1996 | Cliff et al. | 365/230.03 |
| 5,557,217 | 9/1996 | Pedersen | 326/39 |
| 5,586,044 | 12/1996 | Agrawal | 716/16 |
| 5,943,242 | 8/1999 | Vorbach | 712/11 |
| B1 4,617,479 | 9/1993 | Hartmann et al. | 307/465 |

OTHER PUBLICATIONS

Xilinx Corp., *The Programmable Logic Data Book*, "XC2000 Logic Cell Array Families," pp. 2–187 to 2–216 (version 4, Aug. 1994).

Altera Corp. Data Sheet, "FLEX 8000 Programmable Logic Device Family," pp. 1–22 (version 4, Aug. 1994).

Altera Corp., "MAX 5000/EPS464 Programmable Logic Device Family," Altera Data Book, Aug. 1993, ver. 1, pp. 149–160.

Altera Corp., "MAX 7000 Programmable Logic Device Family," Altera Data Book, Aug. 1993, ver. 1, pp. 69–81.

Minnick, "Survey of Microcellular Research," Journal of ACM, Apr. 1967.

Nichols, "A Logical Next Step for Read–Only Memories," Electronics, Jun. 1967.

Shoup, "Programmable Cellular Logic Arrays," Carnegie Mellon Ph.D. Thesis, Mar. 1970.

Fleischer, "The Writeable Personalized Chip," Computer Design, Jun. 1970.

Mukhopadhay, "Recent Developments in Switching Theory," Academic Press, 1970.

Heutink, "Implications of Busing for Cellular Arrays," Computer Design, Nov. 1974.

Wahlstrom, "Programmable Logic Array—Cheaper By the Millions," Electronics, Dec. 1967.

Bursky, Dave, "FPGA Advances Cut Delays, Add Flexibility," Electronic Design, Oct. 1, 1992, vol. 40, No. 20, pp. 35, 38, 40, 42–43.

Cliff, Richard et al., "A Dual Granularity and Globally Interconnected Architecture for a Programmable Logic Device," Proceedings of the IEEE 1993 Custom Integrated Circuits Conference, San Diego, California, May 9–12, 1993, pp. 7.3.2 to 7.3.5.

Carvalho, P. de, "Les FPGA: la famille XC4000 Xilinx," Electronique Radio Plans, No. 545, Apr. 1993, pp. 35–39.

Bursky, Dave, "Fine–Grain FPGA Architecture Uses Four Levels of Configuration Hierarchy," Electronic Design, vol. 41, No. 20, Oct. 1, 1993, pp. 33–34.

COARSE-GRAINED LOOK-UP TABLE ARCHITECTURE

RELATED APPLICATION DATA

The present application is a continuation of application Ser. No. 08/484,831, filed Jun. 7, 1995, now U.S. Pat. No. 5,815,726, which is a continuation-in-part of application Ser. No. 08/334,879, filed Nov. 4, 1994 now abandoned.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks and logic elements and also the interconnections between these logic array blocks and logic elements.

Programmable Logic Devices (PLDS) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, and FLEX® 8000 EPLDs made by Altera Corp.

PLDs are generally known in which many logic array blocks (LABs) are provided in a two-dimensional array. Further, PLDs have an array of intersecting signal conductors for programmably selecting and conducting logic signals to, from, and between the logic array blocks. LABs contain a number of programmable logic elements (LEs) which provide relatively elementary logic functions such as NAND, NOR, and exclusive OR.

Resulting from the continued scaling and shrinking of semiconductor device geometries, which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. In particular, it is important to provide enough interconnection resources between the programmable logic elements so that the capabilities of the logical elements can be fully utilized and so that complex logic functions (e.g., requiring the combination of multiple LABs and LEs) can be performed, without providing so much interconnection resources that there is a wasteful excess of this type of resource.

While such devices have met with substantial success, such devices also meet with certain limitations, especially in situations in which the provision of additional or alternative types of interconnections between the logic modules would have benefits sufficient to justify the additional circuitry and programming complexity. Such additional interconnection paths may be desirable for making frequently needed kinds of interconnections, for speeding certain kinds of interconnections, for allowing short distance connections to be made without tying up a more general-purpose interconnection resource such as long-distance interconnect. There is also a continuing demand for logic devices with larger capacity. This produces a need to implement logic functions more efficiently and to make better use of the portion of the device which is devoted to interconnecting individual logic modules.

As can be seen, an improved programmable logic array integrated circuit architecture is needed, especially an architecture providing additional possibilities for interconnections between the logic modules and improved techniques for organizing and interconnecting the programmable logic elements, including LABs and LEs.

SUMMARY OF THE INVENTION

A new programmable logic device architecture with an improved logic array block (LAB) and improved interconnection resources is provided by virtue of the present invention. The present invention is a programmable logic architecture facilitating the implementation of logic functions. Further, the present invention is an architecture for improving the connections between a cluster of function blocks arranged in a coarser-grained entity called a logic array block (LAB). The present invention enables the construction of larger logical functions (including those requiring multiple LABs) more efficiently. Among the circuitry and interconnection resources for this purpose, at a global level, LABs can be combined together and connected to the input and output cells of a programmable logic integrated circuit through a switchbox-style interconnect scheme of global programmable interconnect resources. Within a LAB, function blocks may be combined using internal feedback and a local interconnect region.

In a PLD of the present invention, global interconnection resources are used to programmably combine and connect signals to and from a plurality of LABs. A LAB is a grouping of programmable resources for implementing logical functions. The global interconnection resources include switch boxes, clock lines, long lines, double lines, single lines, and half- and partially populated multiplexing regions. Long lines run horizontally and vertically for connecting LABs across the whole integrated circuits. Furthermore, output signals from the LABs and signals from input-output blocks of the integrated circuit may drive the long lines. Double lines are for short-distance, local interconnections between two LABs. Clock lines are for driving LAB clock inputs. Switch boxes are used to connect double lines to other double lines in any of three directions.

The present invention includes a LAB having two levels of programmable function blocks. In an embodiment of the present invention, in a first level, there are a plurality of primary four-input function blocks. In a second level, there are a plurality of secondary four-input function blocks and a plurality of secondary two-input function blocks. These programmable function blocks may be implemented using, for example, LUTs. Then the outputs of the primary LUTs feed into the inputs of the secondary LUTs to provide more complex logic functions based on these outputs.

A LAB has registered and combinatorial outputs. Combinatorial outputs may feedback locally, without using global interconnection resources, to the inputs of the primary LUTs via a half-populated input multiplexer region which is local to the LAB. A registered output may feedback to an input of the LAB via the global interconnect resources, external to the LAB. Furthermore, a LAB of the present invention can implement a generate-propagate carry chain. In addition, in a RAM mode, a LAB of the present invention may be configured to implement a RAM memory.

In accordance with the teaching of this invention, a logic array block for a programmable logic device is provided including the following elements: a dedicated input; a first programmable function block for implementing logic functions; and a second programmable function block, selectively coupled to the dedicated input or the first function block, for implementing logic functions. More specifically, the logic array block for a programmable logic device includes: (1) a dedicated input; (2) a first four-input function block for implementing logic functions; (3) a second four-input function block for implementing logic functions; and (4) a first multiplexer block. This first multiplexer block has a first input, coupled to the dedicated input; a second input, coupled to an output of the first four-input function block; and an output, coupled to the second four-input function block. The first multiplexer block is for selectively coupling the dedicated input or the first four-input function block to the second four-input function block.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
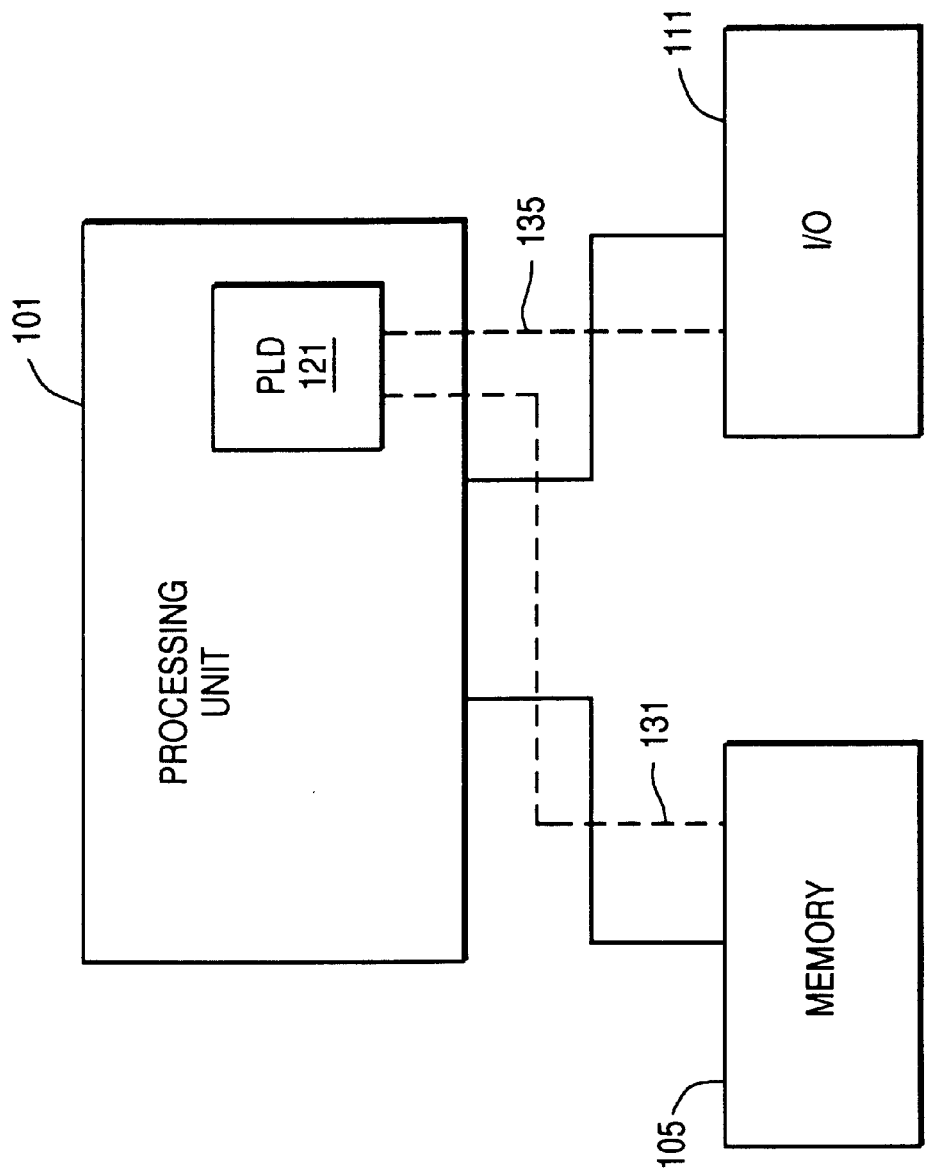
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
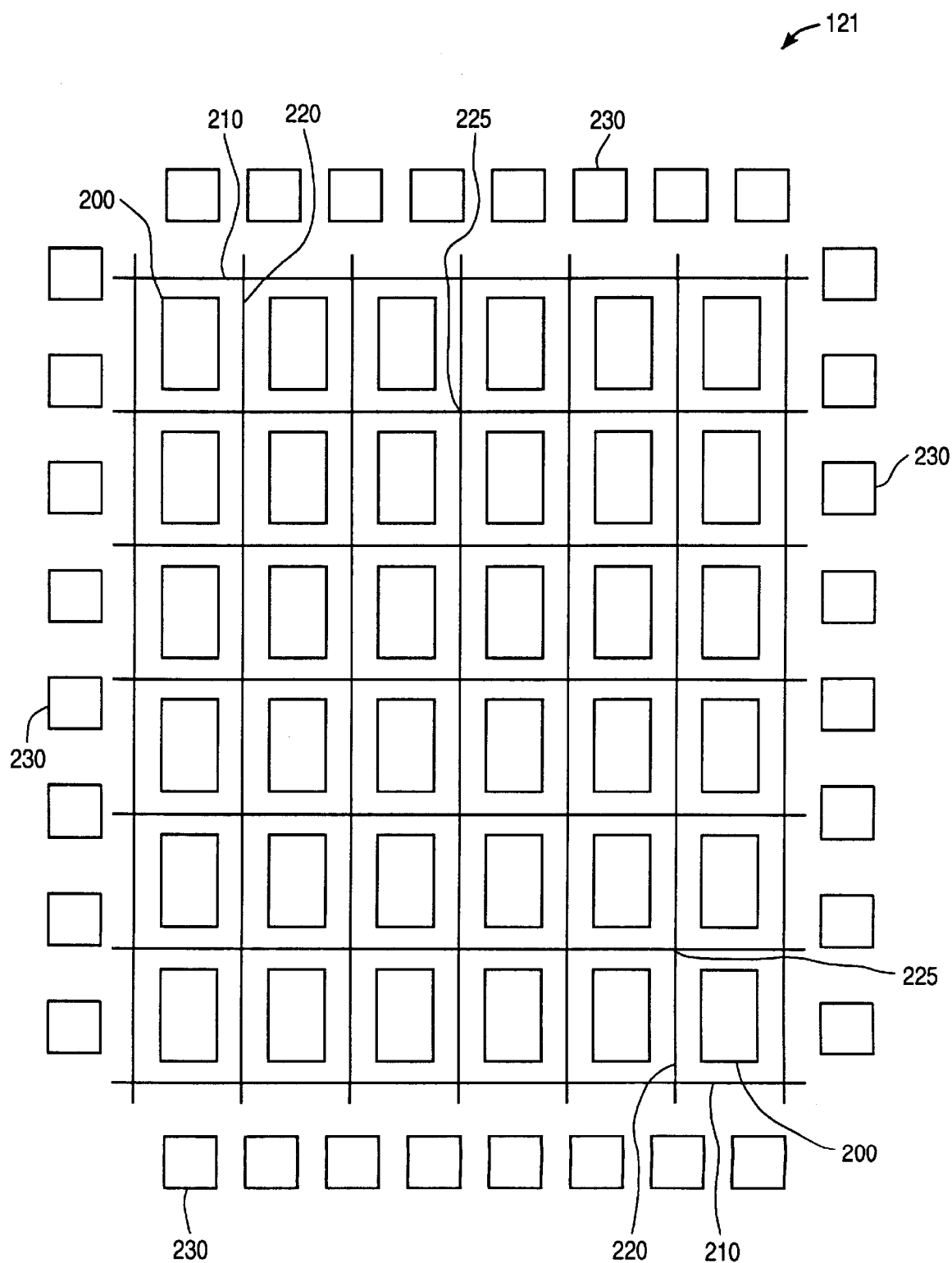
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain an arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors are programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both. For example, one or more GH 210 or GV 220 conductors may be used as a dedicated input driver or dedicated clock network to drive the LABs 200 from an input pin of the integrated circuit.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output driver takes internal signals and interfaces them to the outside world. A bidirectional driver performs the functions of both a input driver and an output driver. In addition, a bidirectional driver has a high-impedance mode which allows the driver to interface with a bidirectional bus. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
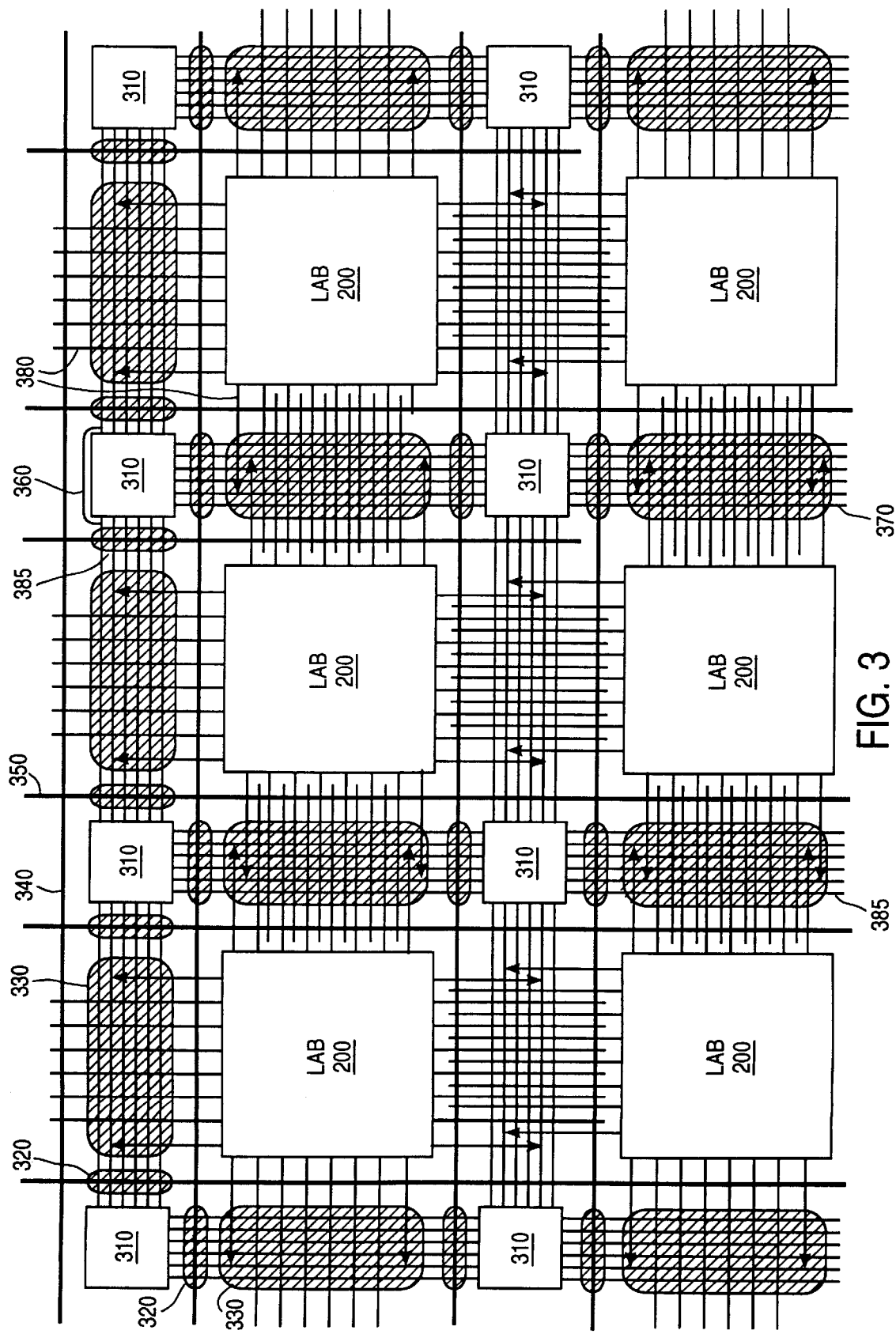
FIG. 3 is a block diagram of an overall interconnection scheme for logic array blocks of the present invention.

FIG. 3 shows a further embodiment of an overall internal architecture and organization of PLD 121 of FIG. 1. PLD 121 of FIG. 3 includes LABs 200, which are physically grouped sets of logical resources that are configured or programmed to perform logical functions. FIG. 3 shows six LABs, arranged in a two-by-three matrix. However, PLD 121 may have any arbitrary number of LABs, more or less than shown in FIG. 3. Furthermore, PLD 121 may be organized in any arbitrary format such as a ten-by-twelve. The internal architecture of a LAB 200 will be described in more detail below.

LABs 200 of FIG. 3 are programmably connectable, as described above in FIG. 2, using global interconnection resources. As in FIG. 2, the global interconnection resources of FIG. 3 are also organized in horizontal and vertical directions. Using these global interconnection resources, LABs 200 may be programmably combined to form larger, more complex logic functions than available from a single LAB. The global interconnection resources of FIG. 3 specifically include switch boxes 310, partially populated multiplexer regions 320, half-populated multiplexer regions 330, horizontal long lines 340, vertical long lines 350, horizontal double lines 360, and vertical double lines 370.

Furthermore, FIG. 3 shows only a portion of PLD 121. PLD 121 may also contain input-output drivers 230 (not shown), as in FIG. 2, for interfacing with PLD 121 with off-chip circuitry. As in FIG. 2, input-output drivers 230 (not shown) are programmably connectable using the global interconnection resources.

There are various types of interconnection resources, distinguishable on the basis of the relative length of their segments. In particular, long lines (also known as "global lines"), including horizontal long lines 340 and vertical long lines 350, are conductors which run the entire length and width of the array. Horizontal long lines 340 extend in a first direction of an array of LABs 200. Vertical long lines 350 extend in a second direction of the array of LABs 200.

Horizontal and vertical long lines 340 and 350 are used to programmably couple signals across the entire PLD 121. In this fashion, multiple LABs 200 may be combined to implement larger, more complex logic functions. Furthermore, long lines 340 and 350 are suitable conductors for distributing high fan-out, time-critical control signals such as a clock signal throughout a PLD integrated circuit with minimal timing skew. Moreover, long lines 340 and 350 may be fashioned into a bidirectional, tristatable bus. In one embodiment, PLD 121 may include long lines dedicated for a particular function, such as a dedicated clock line for routing a clock network.

As shown in FIG. 3, LABs 200 have input-output lines 380 for receiving and providing logic signals. LAB inputs-outputs lines 380 include bidirectional paths, which may be programmed or configured as an input or an output. Furthermore, LAB input-output lines 380 may include dedicated inputs and dedicated outputs. Moreover, LAB input-output lines 380 may includes a combination of bidirectional paths, dedicated inputs, and dedicated outputs.

Using LAB input-output lines 380, horizontal and vertical long lines 340 and 350 may be used to programmably couple signals to and from LABs 200 in different locations of PLD 121. Specifically, long lines 340 and 350 can provide input signals for LAB 200 from other LABs 200. Long lines may also be driven by circuitry such as input-output drivers 230 (not shown). Input-output drivers 230 may be used to programmably couple, through long lines 340 and 350, input signals from external, off-chip circuitry and sources to LABs 200.

Specifically, in one embodiment, dedicated outputs from LAB 200, via LAB input-output lines 380, may be programmably coupled directly, without passing through another global interconnection resource, to horizontal long lines 340. In addition, LAB input-output lines 380 may also be programmably coupled indirectly to horizontal and vertical long lines 340 and 350 through other global interconnection resources including double lines 360 and 370.

To connect to the dedicated inputs of LAB 200, long lines 340 and 350 may be programmably coupled through partially populated multiplexer region 320 (at intersections of long lines 340 and 350 and double lines 360 and 370) to double lines 360 and 370. From double lines 360 and 370, signals may be programmably coupled through half-populated multiplexer region 330, to LAB input-output lines 380 of LAB 200. In other embodiments of the present invention, horizontal and vertical long lines 340 and 350 may be programmably coupled directly to the dedicated inputs of LAB 200 or selected LABs 200.

By not providing a-direct programmable input path from long lines 340 and 350 to LABs 200, this reduces the amount of circuitry required in PLD 121. Overall die size of PLD 121 will be reduced without adversely affecting greatly the performance of the integrated circuit. The negative impact on performance will be minimal. For example, timing skew differences between different LABs 200 will be similar because the same delay will be introduced for the input signals into LAB 200. Furthermore, there will be some increases because less circuitry at the inputs of the LABs 200 also results in reduced parasitics such as resistances and capacitances, which tend to degrade performance.

In addition to horizontal and vertical long lines 340 and 350, PLD 121 of FIG. 3 includes double lines 360 and 370 for routing signals within PLD 121. Like long lines 340 and 350, double lines 360 and 370 extend in the horizontal and vertical directions of the array. Horizontal double lines 360 extend in the first direction of the array of LABs 200. Vertical double lines 370 extend in the second direction of the array of LABs 200. Compared to long lines 340 and 350, double lines 360 and 370 support shorter, local connections between two adjacent LABs 200 without using other global interconnection resources such as switch boxes 310 and long lines 340 and 350. To simplify the diagram in FIG. 3, only the referenced double lines 360 and 370 are shown bypassing switch box 310. Although not shown, other double lines in FIG. 3 also programmably couple two adjacent LABs 200 without using switch boxes 310.

As is the case with long lines 340 and 350, double lines 360 and 370 may be used to combine multiple LABs 200 to implement larger, more complex logic functions. Horizontal and vertical double lines 360 and 370 are used, for example, to programmably couple, through half-populated multiplexer region 330, input and output signals (via LAB input-output lines 380) of one LAB 200 to another LAB 200. This path does not pass through switch boxes 310, horizontal long lines 340, or vertical long lines 350. Since double lines 360 and 370 provide shorter-length interconnections than long lines 340 and 350, double lines 360 and 370 generally have better performance characteristics than long lines 340 and 350. Since long lines 340 and 350 are limited resources, using double lines 360 and 370 reserves long lines 340 and 350 for logic functions requiring longer-length signal paths.

Double lines 360 and 370 can drive or be driven by a LAB 200 which has LAB input-output lines 380 crossing, or intersecting, those particular double lines. More specifically, LAB input-output lines 380 may be programmably coupled to double lines 360 and 370 through half-populated input multiplexer region 330 at intersections of double lines and LAB input-output lines. As discussed above, long lines 340 and 350 may be programmably connected to double lines 360 and 370 through partially populated multiplexer regions 320 at intersections of long lines and double lines.

Double lines 360 and 370 may be programmably coupled to other double lines 360 and 370 via switch boxes 310, discussed below. In particular, to couple signals between more than two LABs 200, horizontal and vertical double lines 360 and 370 may be programmably coupled to another via switch boxes 310, as needed, to implement a particular logic function.

The present invention may include single lines 385, which are similar to double lines 360 and 370 except that these only intersect LAB input-output lines 380 of one LAB 200, instead of two. For examples, single lines 385 may be programmable coupled to other single lines 385 via switch boxes 310. Single lines 385 may drive or be driven by a LAB 200 which has LAB input-output lines 380 crossing, or intersecting, those particular single lines 385. In some embodiments of the present invention, however, the global interconnection resources may not include single lines 385. Single lines 385 permit flexibility in interconnecting signals and LABs 200, but for many of the logic designs programmed into PLDs, a LAB 200 must be connected to at least one other LAB 200. In view of this, the circuitry and other overhead required to implement single lines may be excessive, leading to greater power consumption and larger integrated circuit die sizes than necessary. Further, certain interconnection resources such as switch boxes 310 (used to programmable couple multiple single lines 385) may become the limiting factor in the size of the design that may be implemented in the PLD. Therefore, an effective, efficient PLD architecture may include double lines 360 and 370, but not single lines 385.

Still further embodiments of the present invention may include triple lines, quadruple lines, quintuple lines, sextuple lines, and other similar interconnection resources. Furthermore, in other embodiments of the present invention, there may be special, direct and indirect, connections between LABs 200 that do not pass through the global interconnection resources.

Figure 4A:
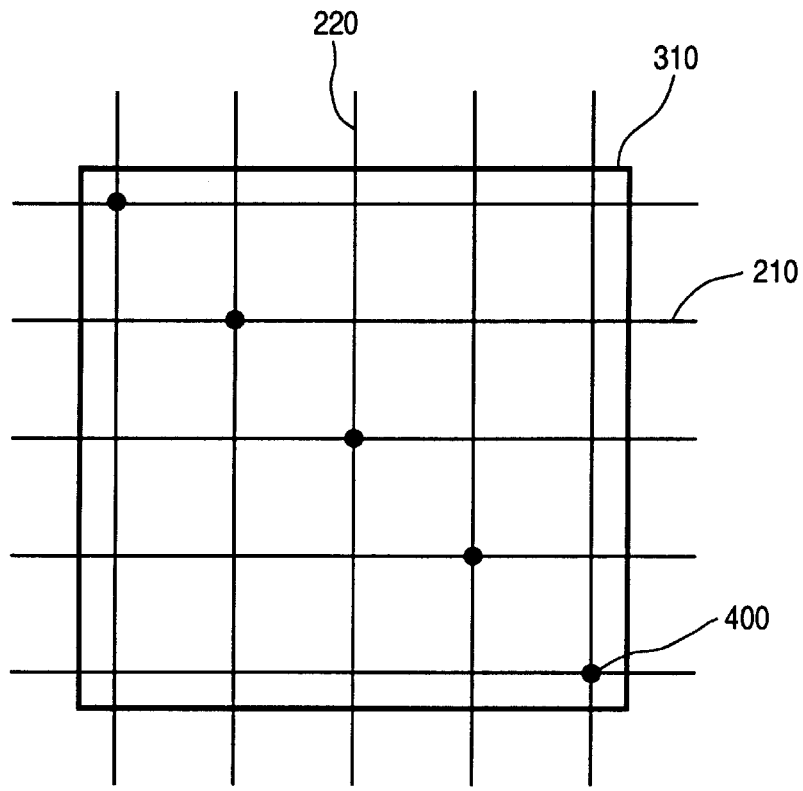
FIG. 4A and 4B are a more detailed diagram of a switch box of the present invention.

Switch boxes 310 are used to connect global interconnection resources with other global interconnection resources. A more detailed diagram of a switch box 310 is shown in FIG. 4A. A plurality of GH 210 and GV 220 conductors input into and output from switch box 310. GH 210 and GV 220 conductors represent global interconnection resources. For example, GH 210 and GV 220 may correspond to horizontal and vertical double lines 360 and 370 of FIG. 3. Switch box 310 is shown as a square arrangement in FIG. 4A, but could be a nonsquare arrangement in other embodiments. Generally, switch box 310 allows a GH 210 or GV 220 conductors to programmably connect to three similar conductors in other directions—in the same direction or to switch directions ("turn a corner") from the horizontal direction to the vertical direction, or vice versa.

Switch boxes 310 are partially populated structures providing selected intersections 400 where GH 210 and GV 220 conductors can be programmably coupled with other such conductors. GH 210 and GV 220 conductors represent global interconnection resources of PLD 121. In particular, GH 210 and GV 220 conductors may represent global interconnection resources including long lines, double lines, single lines, and combinations of these. For example, in the embodiment of FIG. 3, GH 210 and GV 220 conductors represent horizontal double lines 360 and vertical double lines 370, respectively.

Programmable connections are made at selected intersections 400 using multiplexers (not shown). More specifically, GH 210 and GV 220 conductors are programmably connectable at selected intersections 400 of GH 210 and GV 220 conductors. Generally, selected intersections 400 are arbitrarily chosen. In FIG. 4A, selected intersections 400 are arranged diagonally, from an upper left-hand corner of switch box 310 to a lower right-hand corner of switch box 310. However, in other embodiments, selected intersections 400 may be arranged in switch box 310 in another arbitrary arrangement.

In a further embodiment of the present invention, switch boxes 310 contain multiplexers for programmably coupling long lines 340 and 350. Signals routed using long lines 340 and 350 will extend the length and width of PLD 121, as described earlier. Moreover, long lines 340 and 350 may be heavily loaded from driving many LABs 200. Consequently, in one embodiment, the programmable multiplexers of switch boxes 310 for programmably connecting long lines 340 and 350 are buffered to allow signals along these lines to drive the entire length and width of the array. In a still further embodiment of the present invention, GH 210 and GV 220 conductors may represent a combination of horizontal and vertical long lines 340 and 350, and horizontal and vertical double lines 360 and 370, Moreover, long lines 340 and 350 may be buffered while double lines 360 and 370 are not.

Figure 4B:
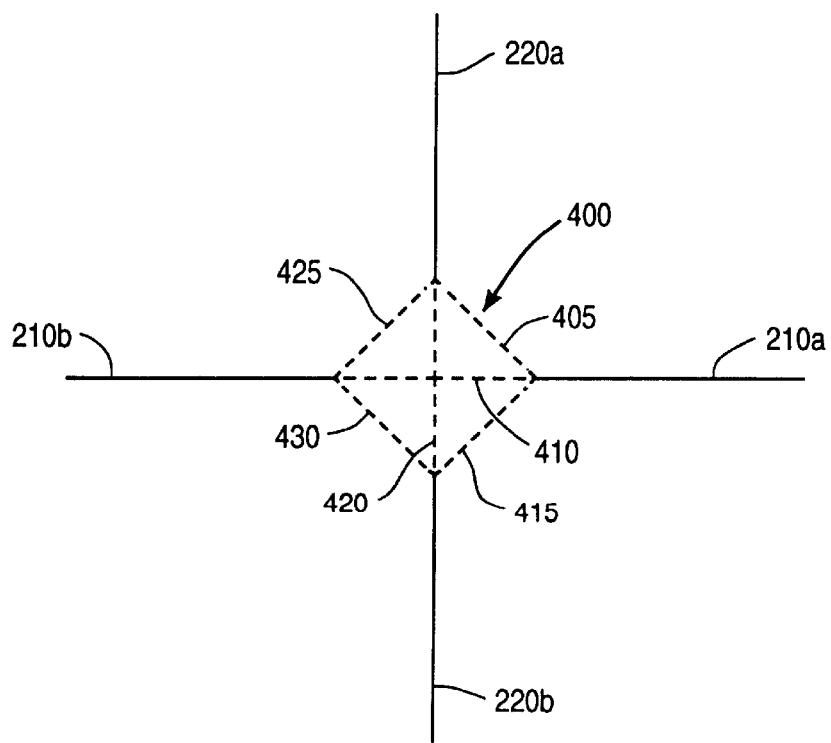

Further details of a selected intersection 400 are shown in FIG. 4B. GH 210A, GH 210B, GV 220A, and GV 220B are global conductors which "intersect" at a various selected intersections 400 in FIG. 4A. As discussed earlier, GH 210A, GH 210B, GV 220A, and GV 220B conductors may represent global interconnection resources including long lines, double lines, single lines, and combinations of these. For example, in the embodiment of FIG. 3, GH 210A, GH 210B, GV 220A, and GV 220B conductors represent horizontal double lines 360 and vertical double lines 370, respectively.

GH 210A, GH 210B, GV 220A, and GV 220B conductors are programmably connectable to another. More specifically, GH 210A is programmably connectable to GV 220A (as indicated by dashed connection 405), GH 210B (as indicated by dashed connection 410), and GV 220B (as indicated by dashed connection 415). GV 220A is programmably connectable to GV 220B (as indicated by dashed connection 420) and GH 210B (as indicated by dashed connection 425). GH 210B is programmably connectable to GV 220B (as indicated by dashed connection 430). These programmable connections are bidirectional and signals can travel in both direction. For example, a signal can be passed along programmable connection 405 from GH 210A to GV 220A and from GV 220A to GH 210A.

Returning to FIG. 3, as discussed earlier, partially populated multiplexer regions 320 are for programmably coupling horizontal and vertical double lines 360 and 370 to horizontal and vertical long lines 340 and 350. In partially populated multiplexer regions 320, long lines 340 and 350 intersect double lines 360 and 370. At these intersections, long lines 340 and 350 may be programmably coupled to double lines 360 and 370. More specifically, regions 320 are implemented using partially populated multiplexer structures. In partially populated multiplexer structures, long lines 340 and 350 may be programmably coupled to double lines 360 and 370 at selected intersections. In further embodiments of the present invention, regions 320 may be fully populated multiplexer structures, where long lines 340 and 350 may be programmably coupled to double lines 360 and 370 at all intersections. In still further embodiments of the present invention, regions 320 may be half-populated multiplexer structures, where long lines 340 and 350 may be programmably coupled to double lines 360 and 370 at half of the intersections.

Half-populated multiplexer regions 330 are for programmably coupling LAB input-output lines 380 from LABs 200 to horizontal and vertical double lines 360 and 370. In half-populated multiplexer regions 330, LAB input-output lines 380 intersect double lines 360 and 370. At these intersections, LAB input-output lines 380 may be programmably coupled to double lines 360 and 370. More specifically, regions 330 are implemented using half-populated multiplexer structures. In half-populated multiplexer structures, LAB input-output lines 380 may be programmably coupled to double lines 360 and 370 at a selected half of the intersections. In further embodiments of the present invention, regions 330 may be fully populated multiplexer structures, where LAB input-output lines 380 may be programmably coupled to double lines 360 and 370 at all intersections. In a still further embodiment of the present invention, regions 330 may be partially populated multiplexer structures, where LAB input-output regions 380 may be programmably coupled to double lines 360 and 370 at a selected portion of the intersections.

Figure 5:
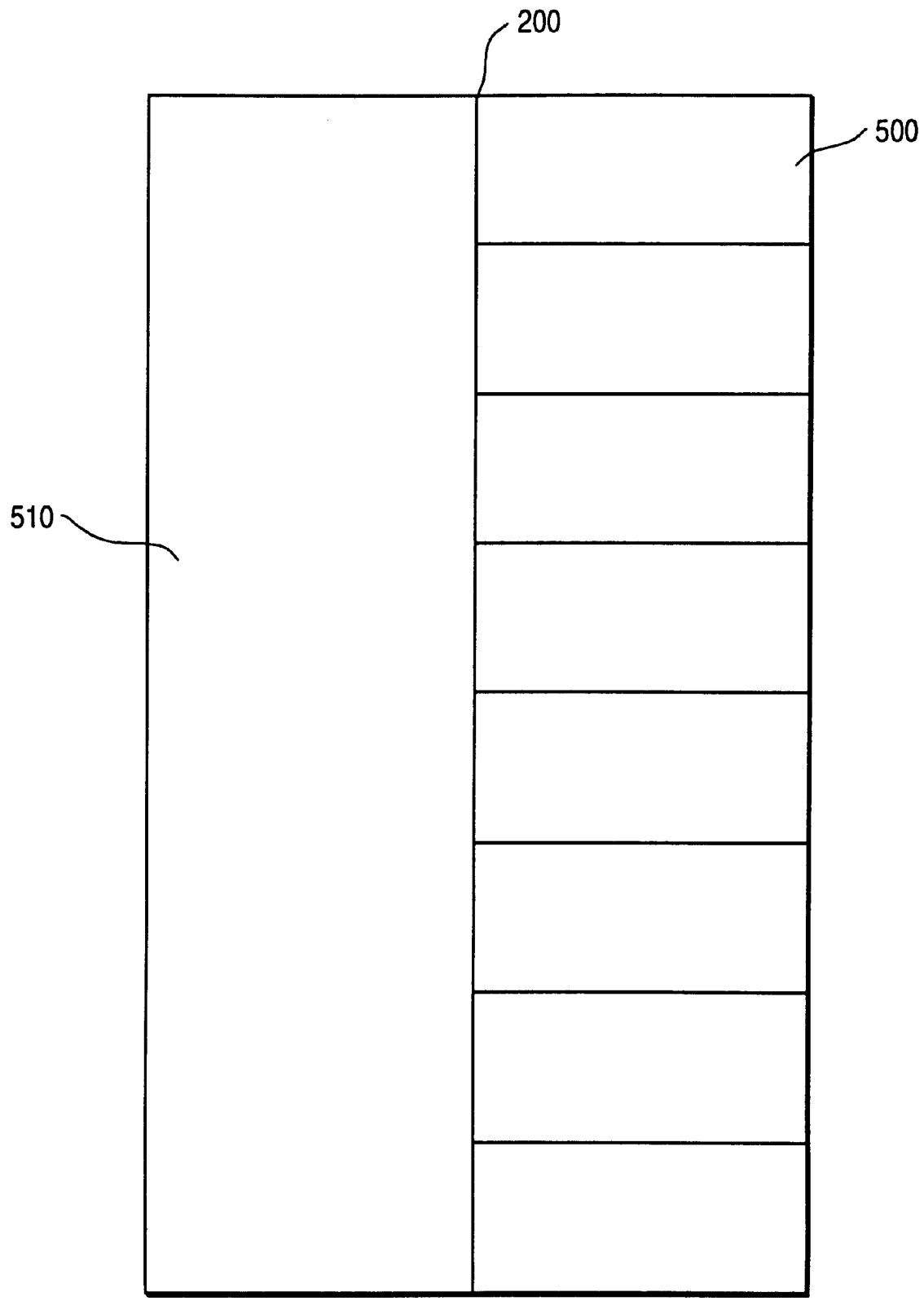
FIG. 5 is a simplified block diagram of a logic array block (LAB) of a programmable logic device.

FIG. 5 shows a simplified block diagram of LAB 200 of FIGS. 2 and 3. LAB 200 is comprised of a varying number of logic elements (LEs) 500, sometimes referred to as "logic cells," and a local (or internal) interconnect structure 510. LAB 200 has eight LEs 500, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A more detailed description of LE 500 of the present invention is given below in connection with FIG. 6. A general overview is presented here, sufficient to provide a basic understanding of LAB 200. LE 500 is the smallest logical building block of a PLD. Signals external to the LAB., such as from GHs 210 and GVs 220, are programmably connected to LE 500 through local interconnect structure 510, although LE 500 may be implemented in many architectures other than those shown in FIGS. 2 and 3. In one embodiment, LE 500 of the present invention incorporates a function generator that is configurable to provide a logical function of a number of variables, such a four-variable boolean operation. As well as combinatorial functions, LE 500 also provides support for sequential and registered functions using, for example, D flip-flops.

LE 500 provides combinatorial and registered outputs that are connectable to the GHs 210 and GVs 220, outside LAB 200. Furthermore, the outputs from LE 500 may be internally fed back into local interconnect structure 510; through local interconnect structure 510, an output from one LE 500 may be programmably connected to the inputs of other LEs 500, without using the global interconnect structure's GHs 210 and GVs 220. Local interconnect structure 510 allows short-distance interconnection of LEs, without utilizing the limited global resources, GHs 210 and GVs 220. Through local interconnect structure 510 and local feedback, LES 500 are programmably connectable to form larger, more complex logical functions than can be realized using a single LE 500. Furthermore, because of its reduced size and shorter length, local interconnect structure 510 has reduced parasitics compared to the global interconnection structure. Consequently, local interconnect structure 510 generally allows signals to propagate faster than through the global interconnect structure.

Figure 6:
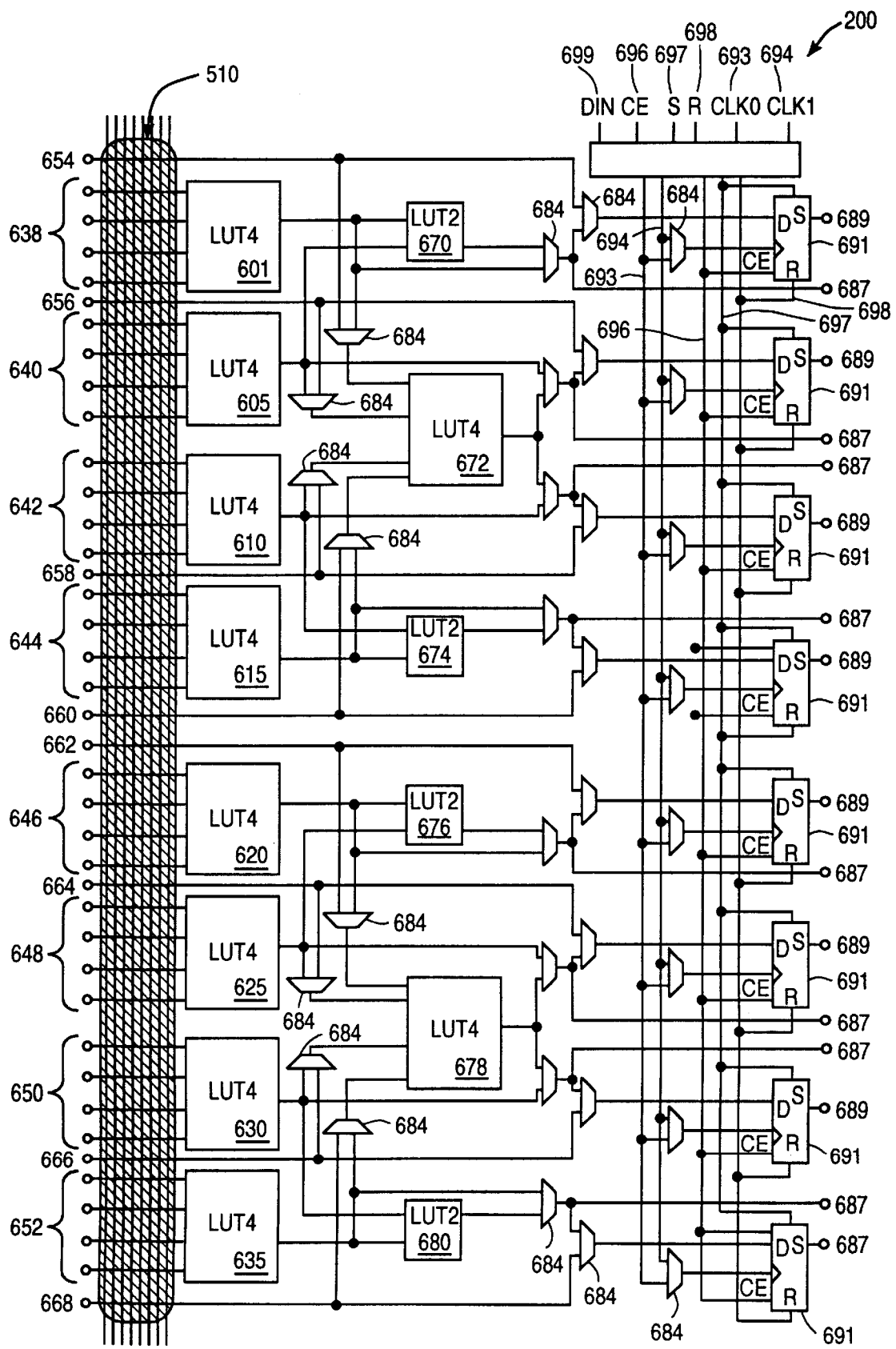
FIG. 6 is a more detailed block diagram of a logic array block of the present invention.

FIG. 6 shows a block diagram of a specific embodiment of LAB 200 of the present invention. LAB 200 of FIG. 6 is configurable to implement logic functions. LAB 200 of FIG. 6 does not have a well-defined LE structure like LAB 200 of FIG. 5. In contrast, LAB 200 of FIG. 6 is a coarser-grained entity without clearly defined repeated structures such as LEs (which is referred to as a fine-grained entity). Here, LAB 200 has eight "primary" programmable function generators. These primary programmable function generators include "primary" four-input look-up tables (LUTs) 601, 605, 610, 615, 620, 625, 630, and 635 in a first level.

LUTs are programmable elements configurable to provide a logical function. In particular, a four-input LUT is configurable to produce the sixteen possible logical outputs for any boolean operation of the four variables. Instead of a look-up table, LUTs may be designed using other programmable systems for performing and/or functionality such as logic gates, flip-flops, multiplexers, and programmable AND-OR arrays.

In a preferred embodiment, LUTs are implemented using a random access memory (RAM). More specifically, LUTs are implemented using a 16-bit RAM, in one specific embodiment, each bit storing an output state corresponding to one of, e.g., sixteen possible input combinations. In further embodiments of the present invention, LUTs may be implemented using other types of memories besides a RAM, such as a first-in, first-out (FIFO) memory or content-addressable memory (CAM), or a combination of these.

A RAM may be constructed using many different fabrication technologies including fuse, antifuse, ferromagnetic core, erasable programmable read-only memory (EPROM), and electrically erasable programmable read-only memory (EEPROM) technology. A RAM may also be constructed from dynamic random access memory (DRAM) or static random access memory (SRAM) technology. In a preferred embodiment of the present invention, the LUTs of FIG. 6 use SRAM memory.

LUTs 601, 605, 610, 615, 620, 625, 630, and 635 have four inputs, which are for the four variables used to select a particular output for that LUT. LUT 601 has four inputs 638; LUT 605 has four inputs 640; LUT 610 has four inputs 642; LUT 615 has four inputs 644; LUT 620 has four inputs 646; LUT 625 has four inputs 648; LUT 630 has four inputs 650; and LUT 635 has four inputs 652. These inputs form part of local interconnect structure 510 (described above) and also a portion of LAB input-output lines 380 of FIG. 3. Signals from within and external to LAB 200 may be connected to these inputs. For example, signals from double lines 360 and 370 may be programmably connected to these inputs of LAB 200.

In addition to the primary LUT inputs, the inputs to LAB 200 in local interconnect structure 510 include eight dedicated inputs 654, 656, 658, 660, 662, 664, 666, and 668. A primary four-input LUT is associated with a particular dedicated input. More specifically, dedicated inputs 654, 656, 658, 660, 662, 664, 666, and 668 are associated with primary LABs 601, 605, 610, 615, 620, 625, 630, and 635, respectively. Dedicated inputs 654, 656, 658, 660, 662, 664, 666, and 668 have multiple uses which are described further below.

These dedicated inputs and the inputs to the LUTs of LAB 200 may be programmably coupled to a signal provided on local interconnect structure 510. In one embodiment, local interconnect structure 510 is a half-populated multiplexer structure. In a half-populated multiplexer structure, only half of the provided signals may be coupled to a particular LUT input. In other embodiments, local interconnect structure 510 may be a fully populated or partially populated multiplexer structure. In a fully populated multiplexer structure, every signal may be coupled to every LUT input. In a partially populated multiplexer structure, only a selected portion of the signals may be coupled to a particular LUT input.

Conceptually, LAB 200 of FIG. 6 may be divided into two groupings of LUTs, both groupings having substantially similar configurations and connections between elements. In particular, LUTs 601, 605, 610, and 615 form a first LUT grouping; LUTs 620, 625, 630, and 635 form a second LUT grouping. This description will only discuss the connections for LUTs 601, 605, 610, and 615 in detail, since LUTs 620, 625, 630, and 635 are similarly connected.

In addition to primary LUTs 601, 605, 610, 615, 620, 625, 630, and 635, there are six secondary function generators. These secondary function generators include LUTs, 670, 672, 674, 676, 678, and 680 in a second level. Generally, the outputs signals from the primary LUTs are fed, directly and indirectly, into the inputs of the secondary LUTs so that larger, more complex logical function can be created from the combination of primary and secondary LUTs. Analogous to the two groupings of the primary LUTs, there are two groupings of secondary LUTs. A first grouping of secondary LUTs is associated with the first grouping of primary LUTs. Similarly, a second grouping of secondary LUTs is associated with the second grouping of primary LUTs. The first grouping contains secondary LUTs 670, 672, and 674. The second grouping contains LUTs 676, 678, and 680. This description will only discuss the connections for LUTs 670, 672, and 674 in detail, since LUTs 676, 678, and 680 are similarly connected.

More specifically, for the first grouping of LUTs, regarding secondary two-input LUT 670, an output from primary LUT 601 is directly coupled to one of two inputs to secondary two-input LUT 670. An output from primary LUT 605 is directly coupled to another input of secondary two-input LUT 670. Regarding secondary two-input LUT 674, an output from primary LUT 610 is directly coupled to one of two inputs to secondary two-input LUT 674. An output from primary LUT 615 is directly coupled to another input of secondary two-input LUT 674.

The second grouping of LUTs are similarly connected. Regarding secondary two-input LUT 676, an output from primary LUT 620 is directly coupled to one of two inputs to secondary two-input LUT 676. An output from primary LUT 625 is directly coupled to another input of secondary two-input LUT 676. Regarding secondary two-input LUT 680, an output from primary LUT 630 is directly coupled to one of two inputs to secondary two-input LUT 680. An output from primary LUT 635 is directly coupled to another input of secondary two-input LUT 680.

Secondary two-input LUTs 670, 672, 678, and 680 are used to generate logic functions based on outputs from the specified primary LUT. These secondary LUTs are used to create larger, more complex logical functions than available with a single primary LUT. In particular, the secondary LUTs facilitate the combination of multiple primary LUTS. For example, secondary two-input LUT 670 can be used to combine primary LUTs 601 and 605 to create a larger five-input LUT for handling functions of up to five variables. Since there are four secondary two-input LUTS, 670, 672, 678, and 680 in the embodiment shown in FIG. 6, four five-input logic functions can be implemented.

LAB 200 of FIG. 6 also includes a plurality of programmable multiplexers 684. Multiplexers 684 are programmably configured to couple a multiplexer input to a multiplexer output. Programmable multiplexers 684 may have an arbitrary number of inputs. In FIG. 6, multiplexers 684 are two-input multiplexers. Multiplexers 684 are controlled, or configured, by way of user-programmable memory cells (not shown), such as SRAM bits. Depending upon the state of such user-programmed bits, an appropriate input of multiplexer 684 is programmably coupled to the output of multiplexer 684.

For the first grouping of LUTS, a multiplexer 684 programmably couples dedicated input 654 and the output of primary LUT 601 to a first input of secondary four-input LUT 672. A multiplexer 684 programmably couples an output of primary LUT 605 and dedicated input 656 to a second input of secondary four-input LUT 672. A multiplexer 684 programmably couples an output of primary LUT 610 and dedicated input 658 to a third input of secondary four-input LUT 672. A multiplexer 684 programmably couples an output of primary LUT 615 and dedicated input 660 to a fourth input of secondary four-input LUT 672.

The second grouping of LUTs are similarly connected to secondary four-input LUT 678. Specifically, a multiplexer 684 programmably couples dedicated input 662 and the output of primary LUT 620 to a first input of secondary four-input LUT 678. A multiplexer 684 programmably couples an output of primary LUT 625 and dedicated input 664 to a second input of secondary four-input LUT 678. A multiplexer 684 programmably couples an output of primary LUT 630 and dedicated input 666 to a third input of secondary four-input LUT 678. A multiplexer 684 programmably couples an output of primary LUT 635 and dedicated input 668 to a fourth input of secondary four-input LUT 678.

Secondary four-input LUTs 672 and 678 are used to generate logic functions based on outputs from a combination of primary LUTs and dedicated inputs. These secondary LUTs 672 and 678 are used to create larger, more complex logical functions than available with a single primary LUT. Secondary LUTs 672 and 678 facilitate the combination of multiple primary LUTs. For example, secondary four-input LUTs 672 may be used to combine primary LUTs 601, 605, 610, and 615 to create a larger six-input LUT for handling functions of up to six variables. Since there are two secondary four-input LUTs, 672 and 678, in the embodiment shown in FIG. 6, two six-input logic functions can be implemented.

Therefore, in LAB 200 of FIG. 6, two six-input logic functions and four five-input logic functions (see above), and combinations of these, can be implemented. For example, LAB 200 of FIG. 6 has eight four-input LUTs, 601, 605, 610, 615, 620, 625, 630, and 635; another two four-input LUTs can be implemented using dedicated inputs 654, 656, 658, 660, 662, 664, 666, and 668, and secondary four-inputs LUTs 672 and 678. In particular, multiplexers 684 are configured to programmably couple dedicated inputs 654, 656, 658, and 660 to secondary four-input LUT 672; and dedicated inputs 662, 664, 666, and 668 are programmably coupled to secondary four-input LUT 678. In this configuration, ten four-input LUTs are available for use.

Primary four-input LUTs 601, 605, 610, 615, 620, 625, 630, and 635 have combinatorial path outputs 687 and registered path outputs 689. LAB 200 of the present invention has eight combinatorial outputs 687 and eight registered outputs 689. Combinatorial path outputs 687 are used to output results of combinatorial logic functions which depend on the present input states in some predetermined fashion; in FIG. 6, this is governed by the configuration information within the LUTs. Registered path outputs 689 are connected to storage blocks 691; these outputs 689 are used to output registered or sequential logic functions which depend on both the input states and the previous history. Registered (or sequential) functions are implemented using some form of memory circuit, including circuits such as registers, flip-flops, and the like.

Combinatorial outputs 687 are programmably selected using programmable multiplexers 684. For the first grouping of LUTs, a multiplexer 684 programmably couples the output of primary LUT 601 and an output of secondary LUT 670 to a combinatorial output 687. A multiplexer 684 programmably couples the output of primary LUT 605 and an output of secondary LUT 672 to a combinatorial output 687. A multiplexer 684 programmably couples the output of primary LUT 610 and the output of secondary LUT 672 to a combinatorial output 687. A multiplexer 684 programmably couples the output of primary LUT 615 and an output of secondary LUT 674 to a combinatorial output 687.

Similarly, for the second grouping of LUTs, a multiplexer 684 programmably couples the output of primary LUT 620 and an output of secondary LUT 676 to a combinatorial output 687. A multiplexer 684 programmably couples the output of primary LUT 625 and an output of secondary LUT 678 to a combinatorial output 687. A multiplexer 684 programmably couples the output of primary LUT 630 and the output of secondary LUT 678 to a combinatorial output 687. A multiplexer 684 programmably couples the output of primary LUT 635 and an output of secondary LUT 680 to a combinatorial output 687.

Combinatorial outputs 687 form a portion of LAB input-output lines 380 of FIG. 3 and are programmably connectable to the global interconnect structure, including long lines and double lines. Furthermore, as discussed earlier, in one embodiment of the present invention, combinatorial outputs 687 are programmably connectable, directly, to horizontal and vertical long lines 340 and 350. Moreover, combinatorial outputs 687 may be programmably connected through the global interconnect structure to LAB input-output lines 380 inputting into other LABs 200 or the same LAB 200 to form more complex logical functions from a combination of LABs 200.

In the embodiment shown in FIG. 6, combinatorial outputs 687 of the present invention feedback into local interconnect structure 510 (not shown to simplify the drawing). As discussed earlier, local interconnect structure 510 is a fully, partially, or half-populated multiplexer region that allows coupling of these combinatorial outputs 687 to the inputs. Consequently, via local interconnect structure 510, combinatorial outputs 687 may be programmably coupled to inputs and dedicated inputs of the primary LUTs, without using interconnect resources outside the LAB such as global interconnect conductors.

In LAB 200 of FIG. 6, there are eight storage blocks 691. A primary four-input LUT may be programmably coupled to a storage block 691 for providing a registered output 689. In particular, for the first grouping of LUTs, a data input of storage block 691 may be programmably coupled to signals from dedicated input 654, the output of primary LUT 601, and the output of secondary LUT 670. More specifically, a multiplexer 684 programmably couples to this data input of storage block 691 signals from: dedicated input 654 and the output of another multiplexer 684 (discussed earlier as being coupled to combinatorial output 687), which programmably selects between the output of primary LUT 601 and the output of secondary LUT 670. These configuration paths could have been obtained using other circuitry such as a three-input multiplexer. However, two two-input multiplexers 684 were used in the embodiment for FIG. 6 since one multiplexer 684 is used for combinatorial output 687. This is similarly the case for the other storage blocks 691.

Further, a data input of a storage block 691 may be programmably coupled to dedicated input 656, the output of primary LUT 605, and the output of secondary LUT 672. In particular, a multiplexer 684 programmably couples to this data input of storage block 691 signals from: dedicated input 656 and the output of another multiplexer 684 (discussed earlier as being coupled to combinatorial output 687), which programmably selects between the output of primary LUT 605 and the output of secondary LUT 672. A data input of a storage block 691 may be programmably coupled to dedicated input 658, the output of primary LUT 610, and the output of secondary LUT 672. In particular, a multiplexer 684 programmably couples to this data input of storage block 691 signals from: dedicated input 658 and the output of another multiplexer 684 (discussed earlier as being coupled to combinatorial output 687), which programmably selects between the output of primary LUT 610 and the output of secondary LUT 672. A data input of a storage block 691 may be programmably coupled to dedicated input 660, the output of primary LUT 615, and the output of secondary LUT 674. In particular, a multiplexer 684 programmably couples to this data input of storage block 691 signals from: dedicated input 660 and the output of another multiplexer 684 (discussed earlier as being coupled to combinatorial output 687), which programmably selects between the output of primary LUT 615 and the output of secondary LUT 674.

Similarly, for the second grouping of LUTs, a data input of a storage block 691 may be programmably coupled to dedicated input 662, the output of primary LUT 620, and the output of secondary LUT 676. In particular, a multiplexer 684 programmably couples to this data input of storage block 691 signals from: dedicated input 662 and the output of another multiplexer 684 (discussed earlier as being coupled to combinatorial output 687), which programmably selects between the output of primary LUT 620 and the output of secondary LUT 676. A data input of a storage block 691 may be programmably coupled to dedicated input 664, the output of primary LUT 625, and the output of secondary LUT 678. In particular, a multiplexer 684 programmably couples to this data input of storage block 691 signals from: dedicated input 664 and the output of another multiplexer 684 (discussed earlier as being coupled to combinatorial output 687), which programmably selects between the output of primary LUT 625 and the output of secondary LUT 678. A data input of a storage block 691 may be programmably coupled to dedicated input 666, the output of primary LUT 630, and the output of secondary LUT 678. In particular, a multiplexer 684 programmably couples to this data input of storage block 691 signals from: dedicated input 666 and the output of another multiplexer 684 (discussed earlier as being coupled to combinatorial output 687), which programmably selects between the output of primary LUT 630 and the output of secondary LUT 678. A data input of a storage block 691 may be programmably coupled to dedicated input 666, the output of primary LUT 635, and the output of secondary LUT 680. In particular, a multiplexer 684 programmably couples to this data input of storage block 691 signals from: dedicated input 668 and the output of another multiplexer 684 (discussed earlier as being coupled to combinatorial output 687), which programmably selects between the output of primary LUT 635 and the output of secondary LUT 680.

Storage blocks 691 are used to store a logic state. Many different logical components elements can be used to form storage blocks 691 including, among others, memory cells, D, T, S-R, J-K, and other types of latches and registers. For example, in the embodiment shown in FIG. 6, storage blocks 691 are D-type registers. In other embodiments of the present invention, LAB 200 may contain T, S-R, J-K, and other types of latches and registers, and combinations of these. Furthermore, in another embodiment, storage block 691 is programmably configurable to operate also as a transparent latch.

LAB 200 has CLK0 693, CLK1 694, CE 696, S 697, R 698, and DIN 699 input lines. These lines govern the functionality, which are sometimes referred to as the "secondary functions," of storage block 691. These lines form a portion of LAB input-output lines 380 (described above), which may be programmably connected to via the global interconnection resources, which include switch boxes 310, double lines 360 and 370, and long lines 340 and 350.

In typical operation, storage block 691 latches in data from its data input and outputs data at its output 689 in response to a clock signal input. A multiplexer 684 programmably couples a CLK0 693 signal and a CLK1 694 signal to the clock signal input of storage block 691. The embodiment shown in FIG. 6 has eight of these multiplexers 684, which are coupled to the clock signal inputs of storage blocks 691, one multiplexer 684 for a storage block 691. Depending on how multiplexer 684 is configured, the clock signal input of storage block 691 can be controlled by either CLK0 693 or CLK1 694 signals. Furthermore, since multiplexers 684 can be programmably configured independently for the eight storage blocks 691, a portion of the registers in LAB 200 may be controlled by CLK0 693 while the other portion is controlled by CLK1 694. Eight storage blocks 691 may be also controlled by the same CLK0 693 signal or CLK1 694 signal.

Storage block 691 may operate in various modes including, among others, leading-edge-triggered register, trailing-edge-triggered register, active-high latch, active-low latch, or as a direct combinatorial bypass. More specifically, in leading-edge-triggered register mode, storage block 691 will function as a register, latching in new data and outputting stored data in response to a leading edge of a clock input. In trailing-edge-triggered register mode, storage block 691 will function as a register that will is responsive to a falling edge of a clock input. In active-high latch mode, storage block 691 will function as a latch, latching data when its clock input is a high. In active-low latch mode, storage block 691 will function as a latch, latching data when its clock input is a low. In direct combinatorial bypass mode, storage block 691 will pass data through without any clocking; in this mode, storage block 691 becomes transparent. Storage blocks 691, or portion thereof, may operate in these modes or a combination of these modes. For example, in the embodiment shown in FIG. 6, storage blocks 691 operate in substantially the same mode, as leading-edge triggered, D-type registers. In another example, one portion of the storage blocks 691 may operate in leading-edge-triggered register mode and another portion operates in active-high latch mode.

Furthermore, storage blocks 691 have clock enable (CE), set (S), and reset (R) signal inputs. In the embodiment shown in FIG. 6, a CE 696 signal directly couples to the CE signal input of storage blocks 691. CE 696 enables clocking of storage block 691, in response to a signal at the clock signal input. More specifically, in operation, when CE 696 is asserted, the clock signal input to storage block 691 may be used to clock storage block 691; when CE 696 is not asserted, storage block 691 may not be clocked. As discussed earlier, CE 696 may be programmably coupled to the global interconnection resources, outside LAB 200. Furthermore, in other embodiments of the present invention, CE 696 may, for example, come from multiple sources and is programmably coupled through a multiplexer 684.

An S 697 signal directly couples to the S signal input of storage blocks 691. S 697 "sets" (or presets) the storage block 691, loading storage block 691 with a "1" or logic high. More specifically, in operation, when S 697 is asserted, storage block 691 is asynchronously set (i.e., sets storage block 691 regardless of the current state of storage block 691); when S 697 is not asserted, normal operation of storage block 691 is enabled. In other embodiments of the present invention, S 697 may synchronously set storage block 691, which means storage block 691 is set at the next clock pulse. As discussed earlier, S 697 may be programmably coupled to the global interconnection resources, outside LAB 200. Furthermore, in other embodiments of the present invention, S 697 may, for example, come from multiple sources and is programmably coupled through a multiplexer 684.

An R 698 signal directly couples to the R signal input of storage blocks 691. R "resets" (or clears) storage block 691, loading the storage block 691 with a "0" or logic low. More specifically, in operation, when R 698 is asserted, storage block 691 is asynchronously reset (i.e., resets storage block 691 regardless of the current state of storage block 691); when R 698 is not asserted, normal operation of storage block 691 is enabled. In other embodiments of the present invention, R 698 may synchronously set storage block 691, which means storage block 691 is reset at the next clock pulse. As discussed earlier, R 698 may be programmably coupled to the global interconnection resources, outside LAB 200. Furthermore, in other embodiments of the present invention, R 698 may, for example, come from multiple sources and is programmably coupled through a multiplexer 684. In FIG. 6, the S 697 and R 698 signals are separate signals. In other embodiments, however, the S 697 and R 698 signals and corresponding functions may be implemented using a single, combined control line.

A DIN 699 signal is also shown in FIG. 6. However, DIN 699 is not used in the embodiment in FIG. 6. Hence, DIN 699 is not shown coupled to storage block 691. DIN 699 is used in a further embodiment or the present invention described below.

Registered outputs 689 form a portion of LAB input-output lines 380 of FIG. 3 and are programmably connectable to the global interconnect structure, including long lines and double lines. Moreover, as discussed earlier, in one embodiment of the present invention, registered outputs 689 are programmably connectable, directly, to horizontal and vertical long lines 340 and 350. Furthermore, registered outputs 689 may be programmably connected through the global interconnect structure to LAB input-output lines 380 inputting into other LABs 200 or the same LAB 200 to form more complex logical functions from a combination of LABs 200.

In one embodiment of the present invention, registered outputs 689 do not feedback into local interconnect structure 510 as do combinatorial outputs 687. However, registered outputs 689 may be fed back and programmably coupled to inputs of the same LAB 200 via the global interconnect structure (described above). The lack of an "internal" feedback path saves valuable integrated circuit area for other features. However, in other embodiments of the present invention, registered outputs 689 may internally feedback into local interconnect structure 510, and may be programmably coupled to the primary LUTs as described above.

Figure 7:
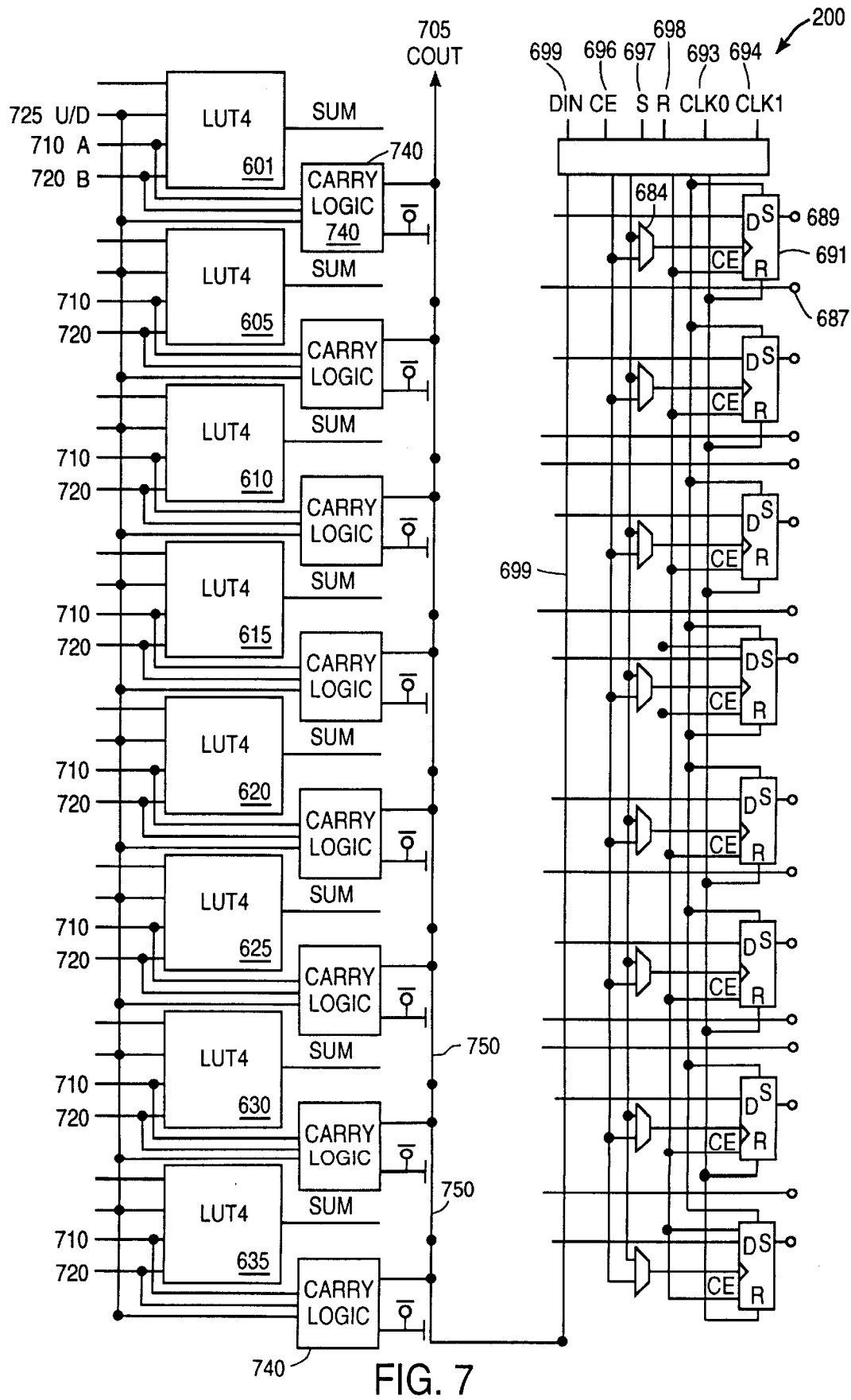
FIG. 7 is a block diagram showing a carry chain scheme of the present invention.

FIG. 7 is a block diagram showing a carry chain scheme for a LAB 200 of FIG. 6. Circuit features shown FIG. 6 are in the embodiment shown in FIG. 7. However, in order to simplify FIG. 7, some of the LAB circuitry has been omitted from the drawing, specifically, the secondary LUTs, some multiplexers 684, and some connections.

When implementing a counter, adder, or other similar function, primary LUTs of LAB 200 are configured to implement a single bit of the logic function. Also, to implement these types of logic function, a carry chain is typically necessary. A carry chain may be implemented when a carry mode is enabled in LAB 200. Among other uses, carry chains may be used to implement arithmetic logic functions such as adders, accumulators, and counters.

A carry-in (CIN) signal is input into LAB 200 via DIN 699. CIN is coupled to the DIN 699 input described earlier; this is a use for the DIN 699 input. Also, as discussed earlier, DIN 699 is programmably connectable to the global interconnection resources; therefore, a CIN signal may be programmably coupled to DIN 699 via long lines, double lines, and other similar conductors and resources. For example, CIN may be output from one LAB 200 and programmably connected through double lines 360 and 370 to another LAB 200.

In a carry chain, primary LUT 635, which is coupled to DIN 699, will represent a first bit for a counter, adder, or other similar logic function implemented. The counter or similar function may have an arbitrary size. Within a single LAB 200, a counter or other similar logical function can have a word size from one bit up to eight bits. The last bit in the carry chain outputs a carry-out (COUT) 705 signal. COUT 705 is programmably connectable to the global interconnection resources. A second bit in the carry chain would be represented by primary LUT 630. A third bit in the carry chain would be represented by primary LUT 625. Similarly, the fourth, fifth, sixth, seventh, and eighth bits for the logic function would be represented by LUTs 620, 615, 610, 605, and 601, respectively.

If more than eight bits are needed, a wider logic function and carry chain may be implemented by programmably coupling multiple LABs 200 through the global interconnect. For example, CIN would input through DIN 699 of one LAB 200 and the carry chain would propagate through the eight LUTs to COUT. This COUT will be programmably coupled through the global interconnect to a DIN 699 of another LAB 200. Multiple LABs 200 are programmably combined in this fashion until the desired-size logic function is obtained.

Furthermore, to implement a counter or similar logic function, an A 710 input and a B 720 input are data inputs to the primary LUTs of a LAB 200. A 710 and B 720 are two operands which will be operated on by LAB 200. For example, in an adder, A 710 will be one addend and B 720 is the other addend. An A 710 input for a particular primary LUT is a particular bit of that operand. A B 720 input for a particular primary LUT is a particular bit of that operand. Another input, U/D 725, to LUT 405 is used for an up-down count control when implementing an up-down counter. For example, for an up-down counter, when U/D 725 is asserted, the counter will increment when clocked; when U/D 725 is not asserted, the counter will decremented when clocked.

An output of the primary LUTs (configured to implement a counter-type logic function in FIG. 7) is a SUM signal. SUM is the result of the logical operation on the A 710 and B 720 operands. Carry logic blocks 740 contain the logic for implementing the carry scheme of the present invention. A carry logic block 740 is coupled to a primary LUT in LAB 200. LAB 200 has eight carry logic blocks 740.

More specifically, carry logic blocks 740 are coupled to the A 710, B 720, and U/D 725 inputs of a primary LUT. A first carry logic block 740, coupled to the inputs of LUT 635, takes a carry input from DIN 699. Other carry logic blocks 740 take a carry output from a previous carry logic block 740 (as indicated by connection 750). A last carry logic block in the chain (shown coupled to primary LUT 601 in FIG. 7) generates the COUT 705 signal, which may be coupled to other LABs 200 through the global interconnection resources. Based on its A 710, B 720, and U/D 725 inputs, carry logic block 740 determines whether to generate or propagate a carry signal to the next carry logic block (via connection 750) in the chain.

In one embodiment, the carry chain of the present invention employs a carry propagate-generate technique. More specifically, a carry bit is either propagated or generated by a primary LUT and passed onto to a succeeding primary LUT. Using this technique, an entire carry chain implemented can be within a LAB 200. The carry chain implementation of the present invention provides easier and more efficient implementation of some logic functions such as an up-down counter.

When the carry chain feature is used, secondary LUTs 672 and 678 (shown in FIG. 6) may still be accessed by the dedicated inputs (i.e., 654, 656, 658, 660, 662, 664, 666, and 668). Secondary LUTs 672 and 678 may drive registers not used by other LUTs. Furthermore, if some primary LUTs are not used in the carry mode, these primary LUTs can be used for implementing logic functions, without impacting the carry chain. For example, three primary LUTs (e.g., 635, 630, and 625) may be used in carry mode; the remaining five primary LUTs (i.e., 620, 615, 610, 605, and 601) may be used to implement other logical function, without affecting the functionality of the carry chain.

Figure 8:
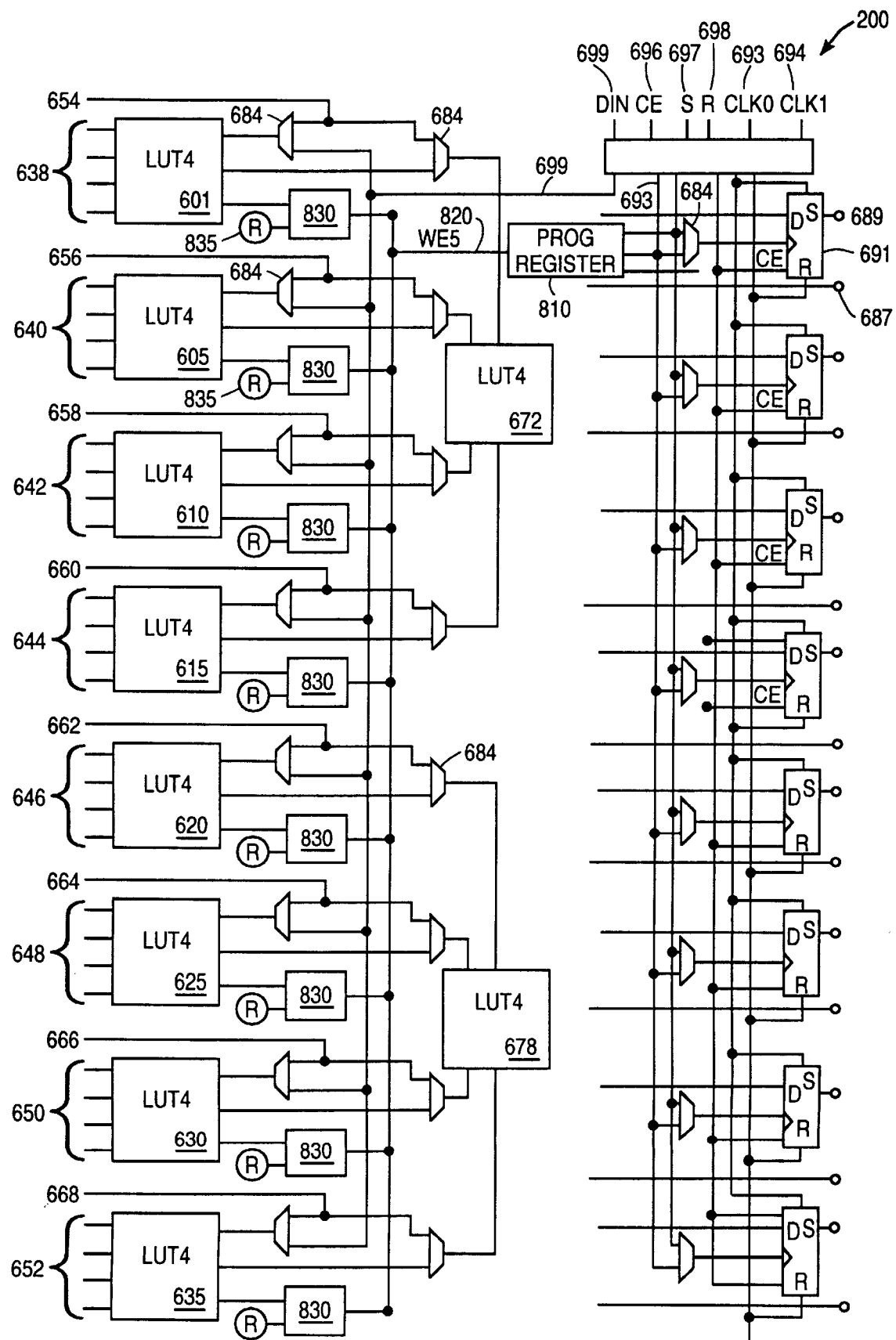
FIG. 8 is a block diagram showing a logic array block of the present invention configured as a random access memory.

FIG. 8 is a block diagram of LAB 200 of FIG. 6 configured to implement a random access memory (RAM). Circuit features shown FIG. 6 are in the embodiment shown in FIG. 8. However, in order to simplify FIG. 8, some of the LAB circuitry has been omitted from the drawing.

As shown in FIG. 8, LAB 200 implements a RAM memory in a RAM mode. In the RAM mode, the primary LUTs serve as individual RAM blocks for storing data. A primary four-input LUT can store up to 16 bits of data. Since there are eight primary LUTs per LAB, LAB 200 can store 128 bits, or 16 bytes of data. The RAM may be organized in a format having any width and depth size. For example, the RAM may have a 4-bit word size and thirty-two words. Furthermore, multiple LABs 200 may be programmably combined to implement larger sized RAMs.

In the RAM mode, the inputs to the primary LUTs are the address pins for the RAM. The CE 696 input (described above) serves as input for a write enable (WE) control signal. WE enables writing or reading of the RAM is cells. When WE is high, the RAM may be written; when WE is low, the RAM may be read, but not written. When implementing larger RAMs using multiple LABs, in order to reduce skew between LABs, a dedicated (global) clock network or long lines 340 and 350 may be used to conduct the WE signal within PLD 121. Furthermore, LAB 200 has a program register 810 for allowing the synchronization of the WE signal with either dedicated clock signal CLK0 or CLK1; the resulting synchronized signal, WES 820, is passed to a WE decode logic block 830.

A primary LUT has a WE decode logic block 830. LAB 200 has eight WE decode logic blocks 830, one coupled to one primary LUT. WE decode logic block 830 enables writing or reading of the RAM based on the state of WES 820. Furthermore, a RAM bit 835 is used by WE decode logic block 830 to control the organization of the RAM. When RAM bit 835 is programmed, the RAM of LAB 200 has a particular word width and depth size such as 128 bits by 1. When RAM bit 835 is not programmed, the RAM of LAB 200 may be organized as 16 bits by 8 bits.

To store or write data into a primary LUT, a data-in multiplexer 684 programmably selects a source of data from either a dedicated input pin or the DIN 699 input. For example, data from dedicated input pin 654 may be written into primary LUT 601; data from dedicated input pin 660 may be written into primary LUT 615. In the alternative, data from DIN 699 may be written into primary LUTs 601 and 615.

To retrieve or read data from a primary LUT, data from a primary LUT is output through the respective LUT output. A multiplexer 684 programmably couples a dedicated input and the output of a primary LUT to an input of a secondary four-input LUT. More specifically, in the first grouping of LUTs, a multiplexer 684 programmably couples dedicated input 654 and the output of a primary LUT 601 to a first input of secondary four-input LUT 672. A multiplexer 684 programmably couples dedicated input 656 and the output of a primary LUT 605 to a second input of secondary four-input LUT 672. A multiplexer 684 programmably couples dedicated input 658 and the output of a primary LUT 610 to a third input of secondary four-input LUT 672. A multiplexer 684 programmably couples dedicated input 660 and the output of a primary LUT 615 to a fourth input of secondary four-input LUT 672.

Similarly for the second grouping of LUTs, a multiplexer 684 programmably couples dedicated input 662 and the output of a primary LUT 620 to a first input of secondary four-input LUT 678. A multiplexer 684 programmably couples dedicated input 664 and the output of a primary LUT 625 to a second input of secondary four-input LUT 678. A multiplexer 684 programmably couples dedicated input 666 and the output of a primary LUT 630 to a third input of secondary four-input LUT 678. A multiplexer 684 programmably couples dedicated input 668 and the output of a primary LUT 635 to a fourth input of secondary four-input LUT 672.

This outputs of secondary LUTs 672 and 678 may be output from LAB 200 using combinatorial output 687 or registered output 689 (connections not shown) as discussed earlier. Secondary LUTs 672 and 678 may perform logical operations on the output signals of the primary LUTs before being output from LAB 200. Furthermore, secondary LUTs 672 and 678 may also be used for decoding addresses for the RAM blocks.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A logic array block for a programmable logic device comprising:
   a first dedicated input;
   a first programmable function block in a first level to implement logic functions;
   a second programmable function block in a second level to implement logic functions, said second programmable function block programmably coupled to said dedicated input and said first programmable function block; and
   a local interconnect region programmably coupling an output of said first programmable function block or an output of said second programmable function block to a selected output of said logic array block, without passing through a global interconnect region of said programmable logic device.

2. The logic array block of claim 1 wherein said local interconnect region is implemented using at least one multiplexer, said at least one multiplexer selectively coupling said first dedicated input, said first programmable function block, or said second programmable function block to a selected output of said logic array block.

3. The logic array block of claim 1 further comprising:
   a multiplexer to couple said output of said first programmable function block or said first dedicated input to said second programmable function block.

4. The logic array block of claim 1 further comprising:
   a register programmably coupled through said local interconnect region to said first and second programmable function blocks.

5. The logic array block of claim 1 further comprising:
   a storage block programmably coupled to said first dedicated input and said first programmable function block.

6. The logic array block of claim 1 further comprising:
   a plurality of storage blocks, wherein said local interconnect region programmably couples said first programmable function block and said second programmable function block to one of said plurality of storage blocks.

7. The logic array block of claim 1 further comprising:
   a carry logic block coupled to said first programmable function block, said carry logic block generating or propagating a carry signal in response to inputs to said first programmable function block.

8. The logic array block of claim 1 wherein at least one of said first and second programmable function blocks is implemented using a look-up table.

9. The logic array block of claim 1 wherein least one of said first and second programmable function blocks is implemented using a static random access memory.

10. The logic array block of claim 9 wherein address data is provided for at least one random access memory through inputs of said first programmable function block.

11. The logic array block of claim 10 further comprising a write enable logic block, coupled to said random access memory, said write enable logic block is responsive to a write enable signal to enable reading and writing of said random access memory.

12. A logic array block for a programmable logic device comprising:
   a first dedicated input;
   a first programmable function block in a first level to implement logic functions;
   a second programmable function block in a second level to implement logic functions, said second programmable function block programmably coupled to said dedicated input and said first programmable function block;
   a local interconnect region programmably coupling an output of said first programmable function block and an output of said second programmable function block to outputs of said logic array block, without passing through a global interconnect region of said programmable logic device; and
   a third programmable function block in the second level to implement logic functions, said third programmable function block coupled to said first programmable function block, wherein an output of said third programmable function block is programmably coupled through said local interconnect structure to said outputs of said logic array block, without passing through said global interconnect region of said programmable logic device.

13. The logic array block of claim 12 further comprising:
   a second dedicated input;
   a multiplexer in the local interconnect region coupled to said first and second programmable function blocks and said second dedicated input, wherein an output of said multiplexer is programmably coupled to said outputs of said logic array block.

14. The logic array block of claim 12 further comprising:
   a storage block programmably coupled to said first dedicated input and said first and third programmable function blocks.

15. A logic array block for a programmable logic device comprising:
  a first programmable function block to implement logic functions;
  a second programmable function block to implement logic functions; and
  a third programmable function block to implement additional logic functions, said third programmable function block programmably coupled to said first and second programmable function blocks.

16. The logic array block of claim 15 further comprising:
  a local interconnect region programmably coupling at least one output of said first and second programmable function blocks to a selected output of said logic array block, without passing through a global interconnect region of said programmable logic device.

17. The logic array block of claim 16 wherein said local interconnect region is implemented using at least one multiplexer, said at least one multiplexer selectively coupling at least one output of said first and third programmable function blocks to a selected output of said logic array block.

18. The logic array block of claim 16 further comprising:
  a plurality of storage blocks, wherein said local interconnect region programmably couples said first and second programmable function blocks to one of said plurality of storage blocks.

19. A logic array block for a logic device comprising:
  a first look-up table to implement logic functions;
  a second look-up table to implement logic functions;
  a third look-up table to implement logic functions, wherein an output of said first look-up table is coupled to a first input of said third look-up table; and
  a multiplexer block selectively coupling said output of said first look-up table to a first input of said second look-up table.

20. The logic array block of claim 19 further comprising:
  a storage block programmably coupled to said first and said second look-up tables.

21. The logic array block of claim 19 further comprising:
  a local interconnect region programmably coupling at least one output of said first and second look-up tables to a selected output of said logic array block, without passing through a global interconnect region of said programmable logic device.

22. A system comprising a programmable logic array block as recited in claim 1.

23. A system comprising a programmable logic array block as recited in claim 12.

24. A system comprising a programmable logic array block as recited in claim 15.

25. A system comprising a logic array block as recited in claim 19.

26. A programmable logic array integrated circuit comprising:
  a first plurality of conductors extending along a first dimension of said two-dimensional array;
  a second plurality of conductors extending along a second dimension of said two-dimensional array, said second plurality of conductors programmably coupled to said first plurality of conductors; and
  a plurality of logic array blocks, wherein a logic array block comprises;
    a first plurality of programmable function blocks in a first level to implement logical functions;
    a second plurality of programmable function blocks in a second level, programmably coupled to said first plurality of programmable function blocks, without passing through said first and second pluralities of conductors, said second plurality of programmable function blocks to implement logical functions of outputs from said first plurality of programmable function blocks; and
    a plurality of dedicated inputs programmably coupled to said second plurality of programmable function blocks.

27. The programmable logic array integrated circuit of claim 26 further comprising:
  a plurality of switch boxes programmably coupling said first plurality of conductors to said second plurality of conductors.

28. The programmable logic array integrated circuit of claim 27 wherein said first plurality of conductors programmable couples signals between at least two logic array blocks without passing through said plurality of switch boxes.

29. The programmable logic array integrated circuit of claim 26 further comprising:
  a plurality of multiplexer regions to couple said first and second pluralities of conductors to said logic array blocks.

30. The programmable logic array integrated circuit of claim 26 further comprising:
  a first plurality of long conductors programmably coupling a plurality of logic array blocks, said first plurality of long conductors extending in said first dimension of said two-dimensional array.

31. The programmable logic array integrated circuit of claim 30 wherein said first plurality of long conductors forms a tristateable bus.

32. The programmable logic array integrated circuit of claim 30 further comprising:
  a plurality of multiplexer regions programmably coupling said first plurality of long conductors to said second plurality of conductors.

33. The programmable logic array integrated circuit of claim 30 further comprising:
  a second plurality of long conductors programmably coupling said plurality of logic array blocks, said second plurality of long conductors extending in said second dimension of said two-dimensional array,
  wherein said plurality of logic array blocks are not adjacent to another.

34. The programmable logic array integrated circuit of claim 33 wherein outputs from said logic array blocks are programmably coupled to at least one of said first and second pluralities of long conductors, without passing through a multiplexer region.

35. A system comprising a logic array block integrated circuit as recited in claim 26.

36. A random access memory for a programmable logic device comprising:
  a first dedicated input;
  a first programmable function block to implement logic functions;
  a second programmable function block to implement logic functions, said second programmable function block programmably coupled to said dedicated input and said first programmable function block; and
  a local interconnect region programmably coupling outputs of said first and second programmable function blocks, without passing through a global interconnect region of said programmable logic device.

37. The random access memory of claim 36 wherein address data is provided for said random access memory through inputs of said first programmable function block, and said second programmable function block is configured to decode address data for said random access memory.

38. The random access memory of claim 36 wherein address data is provided to said random access memory through inputs of said first programmable function block and wherein said dedicated input is programmably coupled to said first programmable function block for loading random access memory data into said first programmable function block when said first programmable function block is configured as a random access memory.

39. The random access memory of claim 36 further comprising:

a program register to synchronize a write enable signal with a clock source; and a data input programmably coupled to said first programmable function block, said data input loading random access memory data into said random access memory, wherein address data is provided for at least one random access memory through inputs of said first programmable function block.

40. The logic array block of claim 1 wherein the first programmable function block is a look-up table.

41. The logic array block of claim 1 wherein the second programmable function block is a look-up table.

42. The logic array block of claim 1 wherein the first and second programmable function blocks are look-up tables.

43. The logic array block of claim 12 wherein the first programmable function block is a look-up table.

44. The logic array block of claim 12 wherein the second programmable function block is a look-up table.

45. The logic array block of claim 12 wherein the third programmable function block is a look-up table.

46. The logic array block of claim 12 wherein the first, second, and third programmable function blocks are look-up tables.

47. The logic array block of claim 15 wherein the first programmable function block is a look-up table.

48. The logic array block of claim 15 wherein the second programmable function block is a look-up table.

49. The logic array block of claim 15 wherein the third programmable function block is a look-up table.

50. The logic array block of claim 15 wherein the first, second, and third programmable function blocks are look-up tables.

51. The programmable logic array integrated circuit of claim 26 wherein the first plurality of programmable function blocks are a first plurality of look-up tables.

52. The programmable logic array integrated circuit of claim 26 wherein the second plurality of programmable function blocks are a second plurality of look-up tables.

53. The programmable logic array integrated circuit of claim 26 wherein the programmable function blocks are look-up tables.

54. The random access memory of claim 36 wherein the first programmable function block is a look-up table.

55. The random access memory of claim 36 wherein the second programmable function block is a look-up table.

56. The random access memory of claim 36 wherein the first and second programmable function blocks are look-up tables.

* * * * *